(12) United States Patent
Sharma et al.

(10) Patent No.: US 11,658,208 B2
(45) Date of Patent: May 23, 2023

(54) THIN FILM TRANSISTORS FOR HIGH VOLTAGE APPLICATIONS

(71) Applicant: Intel Corporation, Santa Clara, CA (US)

(72) Inventors: Abhishek A. Sharma, Hillsboro, OR (US); Willy Rachmady, Beaverton, OR (US); Van H. Le, Beaverton, OR (US); Gilbert Dewey, Hillsboro, OR (US); Ravi Pillarisetty, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1283 days.

(21) Appl. No.: 15/926,969

(22) Filed: Mar. 20, 2018

(65) Prior Publication Data

US 2019/0296104 A1    Sep. 26, 2019

(51) Int. Cl.
| | |
|---|---|
| *H01L 29/06* | (2006.01) |
| *H01L 29/66* | (2006.01) |
| *H01L 29/51* | (2006.01) |
| *H01L 21/28* | (2006.01) |
| *H01L 27/11573* | (2017.01) |
| *H01L 29/792* | (2006.01) |

(52) U.S. Cl.
CPC ........ *H01L 29/0611* (2013.01); *H01L 29/517* (2013.01); *H01L 29/66742* (2013.01); *H01L 27/11573* (2013.01); *H01L 29/40117* (2019.08); *H01L 29/66833* (2013.01); *H01L 29/792* (2013.01)

(58) Field of Classification Search
CPC .............. H01L 29/0611; H01L 29/517; H01L 29/66742; H01L 29/4908; H01L 29/66969; H01L 29/78696; H01L 29/78669; H01L 29/78678; H01L 29/66765; H01L 29/78648; H01L 27/11573; H01L 29/40117
See application file for complete search history.

(56) References Cited

U.S. PATENT DOCUMENTS

| | | | | |
|---|---|---|---|---|
| 9,608,119 | B2* | 3/2017 | Tang | H01L 29/78645 |
| 2015/0215840 | A1* | 7/2015 | Yiu | H04W 76/15 |
| | | | | 370/329 |
| 2015/0279674 | A1* | 10/2015 | Cho | H01L 29/7869 |
| | | | | 257/43 |
| 2017/0317183 | A1* | 11/2017 | Kato | H01L 21/28264 |
| 2018/0308957 | A1* | 10/2018 | Abe | H01L 29/40117 |

OTHER PUBLICATIONS

CN 105892221 (Year: 2016).*

* cited by examiner

*Primary Examiner* — Patricia D Valenzuela
(74) *Attorney, Agent, or Firm* — Essential Patents Group, LLP (57) ABSTRACT

A thin film transistor (TFT) apparatus is disclosed, where the apparatus includes a gate comprising metal, a source and a drain, a semiconductor body, and two or more dielectric structures between the gate and the semiconductor body. In an example, the two or more dielectric structures may include at least a first dielectric structure having a first bandgap and a second dielectric structure having a second bandgap. The first bandgap may be different from the second bandgap. The TFT apparatus may be a back-gated TFT apparatus where the source is at least in part coplanar with the drain, and the gate is non-coplanar with the source and the drain.

20 Claims, 7 Drawing Sheets

THIN FILM TRANSISTORS FOR HIGH VOLTAGE APPLICATIONS

BACKGROUND

Some thin film transistors (TFT) may have relatively low breakdown voltages, which may make these TFTs not suitable for power applications (e.g., high voltage applications). It may be useful to increase breakdown voltages of these TFTs.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

In some embodiments, to increase a breakdown voltage of a transistor (e.g., a back-gated TFT), a plurality of layers of dielectric material (e.g., which may form gate oxide layers or gate dielectric layers of the transistor) may be used between a gate and a channel. For example, any two adjacent layers of the plurality of layers may comprise dissimilar dielectric material having different bandgaps. As discussed in further details herein later, the multiple dielectric layers between the channel and the gate (e.g., instead of using a single, thick dielectric layer) may increase a breakdown voltage of the combined dielectric layer. For example, an interface between two adjacent dielectric layers having two different bandgaps may act as a barrier to transmission of current from the channel to the gate. There may be drop of field across the interface between two adjacent dielectric layers (e.g., having two different bandgaps) of the combined dielectric layer. As fluence of carriers are reduced at the interface between two adjacent dielectric layers, the combined dielectric layer may not break down easily (e.g., takes relatively longer time and/or higher voltage for the breakdown of the combined dielectric layer), which may increase a breakdown voltage of the transistor.

In some embodiments, to further increase the breakdown voltage, a length of the channel may be increased. To increase the channel length, the channel may be formed in an "U" shape with a recess, merely as an example. For example, source and drains may be formed on two respectively sidewalls of the channel, and a midsection of the channel may be formed on the plurality of layers and the gate. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Figure 1:
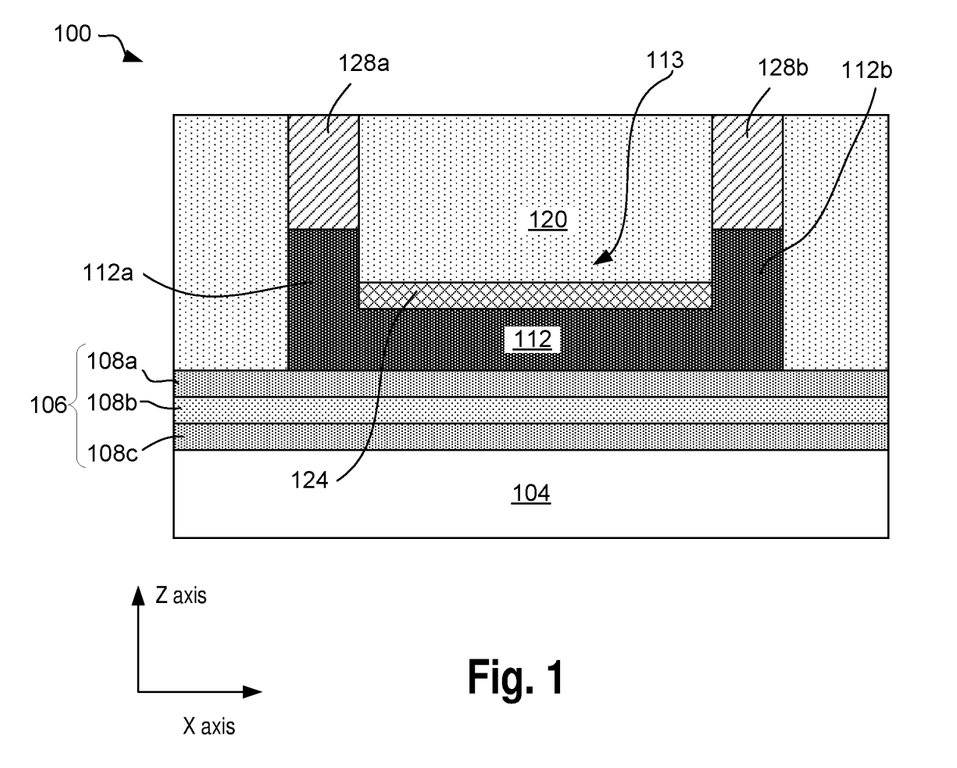
FIG. 1 schematically illustrates a cross sectional view of a thin film transistor (TFT), (also referred to as a transistor) which includes a plurality of gate dielectric layers and/or a channel structure comprising a recess, according to some embodiments.

FIG. 1 schematically illustrates a cross sectional view of a thin film transistor 100 (also referred to as a transistor 100) which includes a plurality of gate dielectric layers 106 and/or a channel structure 112 comprising a recess, according to some embodiments.

In an example, the transistor 100 may be suitable for high voltage applications. For example, as discussed herein in further details, the plurality of gate dielectric layers 106 and/or a "U" shape of a channel structure 112 may contribute to the transistor 100 being able to handle relatively high voltage, e.g., voltages higher than about 1.5 Volts (V), about 5 V, in the range of 1.5-5 V, and/or the like.

In some examples, transistor 100 is a back-gated TFT. TFTs are a class of field-effect transistors (FETs) in which the channel material is a deposited thin film, rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology. TFTs can be fabricated using a wide variety of semiconductor materials, such as silicon, germanium, silicon-germanium, as well as various oxide semiconductors (a.k.a. semiconducting oxides) including metal oxides such as indium gallium zinc oxide (IGZO), indium zinc oxide (IZO), and the like.

In some embodiments, transistor 100 is a back-gated TFT, where a gate 104 is formed first. In the back-gated transistor 100, a source 128a and a drain 128b are at least in part coplanar, whereas the gate 104 is not coplanar with the source 128a and/or the drain 128b (e.g., the gate 104 is at a backside of the source 128a and/or the drain 128b).

In some embodiments, the gate 104 comprises one or more metal(s), one or more metal alloy(s), one or more conductive material(s), and/or another appropriate material. For example, the gate 104 includes one or more of: Titanium (Ti), Tantalum (Ta), Tungsten (W), Platinum (Pt), Chromium (Cr), Hafnium (Hf), Copper (Cu), Cobalt (Co), Indium (In), Titanium nitride (TiN), and/or the like. In some embodiments, the gate 104 has a thickness in the range of 5 nm (nanometer) to 20 nm, although any other appropriate range of thickness of the gate may also be possible. In some embodiments, a length of the gate 104 may be in the range of 20-200 nm, although any other appropriate range of gate length may also be possible.

In some embodiments, the transistor 100 comprises a semiconductor body structure 112, which may be a channel structure (also referred to as a channel layer 112, a channel structure 112, or simply as a channel 112). In some embodiments, two or more dielectric layers 108 are between the channel 112 and the gate 104. The example of FIG. 1 illustrates three dielectric layers 108a, 108b, 108c—although in other examples, there may be two, four, or higher number of dielectric layers. In an example, there may be at least two and/or at most four dielectric layers between the channel 112 and the gate 104. The dielectric layers 108a, 108b, 108c are collectively referred to as a combined dielectric layer 106, and also as a dielectric layer 108 in singular, and dielectric layers 108 in plural.

The dielectric layers 108 are, for example, gate oxide layers or gate dielectric layers. Individual dielectric layer 108 comprises dielectric material, e.g., high-K dielectric material. Merely as an example, individual ones of the dielectric layers 108 comprises Hafnium dioxide ($HfO_2$), Aluminum oxide ($Al_2O_3$), Hafnium zirconium oxide ($HfZrO_2$ or HZO), and/or the like. In another example, individual ones of the dielectric layers 108 comprises Hafnium silicate ($HfSiO_4$), Zirconium silicate ($ZrSiO_4$), Zirconium dioxide ($ZrO_2$), Nitride hafnium silicate (HfSiON), and/or the like. In some embodiments, individual ones of the dielectric layers 108 comprises one or more of: Hf, Si, O, Zr, Al, or N.

In some embodiments, two adjacent dielectric layers 108 comprise corresponding two corresponding different materials (e.g., two adjacent dielectric layers 108a, 108b may not comprise the same material). For example, if the dielectric layer 108b comprises $Al_2O_3$, then the dielectric layers 108a and 108c may not comprise $Al_2O_3$. In such an example, the dielectric layers 108a and 108c may comprise HZO. Thus, merely as an example, the dielectric layers 108a, 108b and 108c may respectively comprise HZO, $Al_2O_3$, and HZO. In another example, the dielectric layers 108a, 108b and 108c may respectively comprise $Al_2O_3$, HZO, and $Al_2O_3$. In yet another example, the dielectric layers 108a, 108b and 108c may respectively comprise $HfO_2$, $Al_2O_3$, and $HfO_2$, or may respectively comprise $Al_2O_3$, $HfO_2$, and $Al_2O_3$. Any other combination may also be possible.

In another example, the combined dielectric layer 106 may comprise merely two dielectric layers 108a and 108b (e.g., the dielectric layer 108c may be absent), and the two dielectric layers 108a and 108b may respectively comprise $HfO_2$ and $Al_2O_3$, may respectively comprise $Al_2O_3$ and $HfO_2$, or may respectively comprise any two materials discussed herein above.

In some embodiments, two adjacent dielectric layers 108 comprise corresponding two different material having corresponding two different bandgaps (e.g., two adjacent dielectric layers 108 may not comprise material having the same bandgap). Thus, for example, the layer 108a may comprise a first material having a first bandgap, and the layer 108b may comprise a second material having a second bandgap, where the second bandgap may be different from the first bandgap. In an example, the layer 108c may comprise a third material having a third bandgap, where the third bandgap may be different from the second bandgap. In an example, the third bandgap of the layer 108c may be about the same as the first bandgap of the layer 108a, although in another example the third bandgap may be different from the first bandgap.

In some embodiments, a thickness of the combined dielectric layer 106 may be at least about 5 nm, in the range of 5-20 nm, and/or the like. Thus, a combination of the thicknesses of individual dielectric layers 108 may be at least about 5 nm, in the range of 5-20 nm, and/or the like. The thickness of the combined dielectric layer 106 may be divided among the various dielectric layers 108.

In an example, an effective dielectric constant of the combined dielectric layer 106 may be at least about 15 or higher. Thus, although the dielectric constant of individual layers 108 may be less than, or more than, 15 (e.g., dielectric constant of individual layers 108 may be 25, 12, etc., merely as examples), the effective dielectric constant of the combined dielectric layer 106 may be at least about 15 or higher. In an example, a breakdown field of the combined dielectric layer 106 may be at least about 1 megavolt/cm, or higher.

In an example, including multiple dielectric layers 108 between the channel 112 and the gate 104 (e.g., instead of using a single, thick dielectric layer) may have several technical effects. The multiple dielectric layers 108 between the channel 112 and the gate 104 (e.g., instead of using a single, thick dielectric layer) may increase a breakdown voltage of the combined dielectric layer 106. For example, an interface between two adjacent dielectric layers having two different bandgaps (e.g., the interface between dielectric layers 108a, 108b, or the interface between dielectric layers 108b, 108c) may act as a barrier to transmission of current from the channel 112 to the gate 104. There may be drop of field across the interface between two adjacent dielectric layers (e.g., having two different bandgaps) of the combined dielectric layer 106. As fluence of carriers are reduced at the interface between two adjacent dielectric layers, the combined dielectric layer 106 may not break down easily (e.g., may take relatively longer time and/or higher voltage for the breakdown of the combined dielectric layer 106).

As an example, assume a first scenario having a single dielectric layer of thickness 6 nm between the channel 112 and the gate 104 (where the first scenario is not illustrated in FIG. 1), and assume a second scenario having a three dielectric layers 108a, 108b, 108c of thickness 2 nm each between the channel 112 and the gate 104 (where the second scenario is illustrated in FIG. 1). As in the second scenario there are two interfaces between the dielectric layers, the combined dielectric layer 106 in the second scenario may not break down easily compared to the first scenario (e.g., may take relatively longer time and/or higher voltage for the breakdown of the combined dielectric layer 106 in the second scenario, compared to the first scenario). In an example, the single dielectric layer of the first scenario can arguably be made thicker to achieve the higher breakdown threshold, but such higher thickness may result in loss of effective control of the channel 112 by the gate 104, and in some situations (e.g., for short channel devices) the transistor cannot be easily turned off. In contrast, the multiple thin layers of the combined dielectric layer 106 may have relatively less thickness (e.g., between 5-20 nm), have increased control of the gate 104 over the channel 112, and also have higher breakdown voltage.

In some embodiments, the channel (or semiconductor body) 112 may be at least in part on the combined dielectric layer 106. In an example, the channel material is a deposited as thin film, e.g., rather than a monocrystalline material. In some embodiments, to make an n-type transistor 100, the channel 112 may comprise one or more of: Indium tin oxide (ITO), Indium gallium zinc oxide (IGZO), Indium Zinc Oxide (IZO), amorphous silicon (a-Si), a-Germanium (a-Ge), poly-Si, or poly-Ge, or poly-Group III-V elements. In some embodiments, to make a p-type transistor 100, the channel 112 may comprise one or more of: cuprous oxide (Cu2O), Stannic or Stannous oxide (SnOx), a-Si, a-Ge, or poly-Ge, or poly-Group III-V elements. In an example, the channel 112 may have a thickness in the range of about 5 nm to about 50 nm.

In some embodiments, the channel 112 may have a roughly "U" shape, as illustrated in the cross-sectional view of FIG. 1. For example, the channel 112 may have a mid-section over the combined dielectric layer 106. A first end 112a of the channel 112, a second end 112b of the channel 112, and the mid-section of the channel may define a cavity or recess 113 within the channel 112. For example, the first end 112a and the second end 112b may form sidewalls of the channel 112.

In some embodiments, the U shape of the channel 112 (e.g., such that the recess 113 is formed within the channel 112) may increase an effective channel length, which may increase in a control of the channel 112 by the gate 104, and/or may increase an effective breakdown voltage of the transistor 100.

In some embodiments, a source 128a may be formed on the first end 112a of the channel 112, and a drain 128b may be formed on the second end 112b of the channel 112. In some embodiments, the source 128a and/or the drain 128b comprise a material which includes one or more of: Titanium (Ti), Titanium nitride (TiN), Nitrogen (N), Copper (Cu), Cobalt, Indium (In), Tantalum (Ta), Tungsten (W), Carbon (C), Platinum (Pt), Chromium (Cr), Hafnium (Hf), or the like.

In some embodiments, a passivation layer 124 may be at least in part within the recess 113. In some embodiments, the passivation layer 124 is an Interlayer Dielectric (ILD). For example, one or more of porous $SiO_2$, fluorine-doped $SiO_2$, carbon-doped $SiO_2$, porous-doped $SiO_2$, spin-on silicon based polymeric dielectric, spin-on organic polymeric dielectric, may be used for the passivation layer 124.

In some embodiments, ILD 120 may be at least in part within the recess 113, and may at least in part encapsulate the channel 112, the source 128a, the drain 128b, etc. Any appropriate interlayer dielectric may be used for the ILD 120. For example, the ILD 120 may comprise one or more of: Silicon dioxide ($SiO_2$), Aluminum oxide ($Al_2O_3$), hafnium zirconate ($HfZrO_4$), Hafnium dioxide ($HFO_2$), Silicon nitride ($Si_3N_4$), Silicon oxynitride (SiOxNy), Aluminum oxynitride (AlON), Hafnium oxynitride (HfON), Hafnium Aluminum Oxide $(HfO_2)x(Al_2O_3)$, porous $SiO_2$, fluorine-doped $SiO_2$, carbon-doped $SiO_2$, porous-doped $SiO_2$, spin-on silicon based polymeric dielectric, spin-on organic polymeric dielectric, etc. In some embodiments and although not illustrated in FIG. 1, the transistor 100 may include other components, e.g., a hard mask layer over the passivation layer, spacers, etc.

As discussed herein above, the combined dielectric layer 106 comprising the multiple dielectric layers 108a, 108b, and 108c may contribute to increasing a breakdown voltage of the transistor 100. Also, the U shape of the channel 112 may also contribute to increasing the breakdown voltage of the transistor 100. In some embodiments, because of such features, the transistor 100 may be suitable for relatively high voltage applications (e.g., voltages higher than about 1.5 V, about 5 V, in the range of 1.5-5 V, and/or the like).

Figure 2:
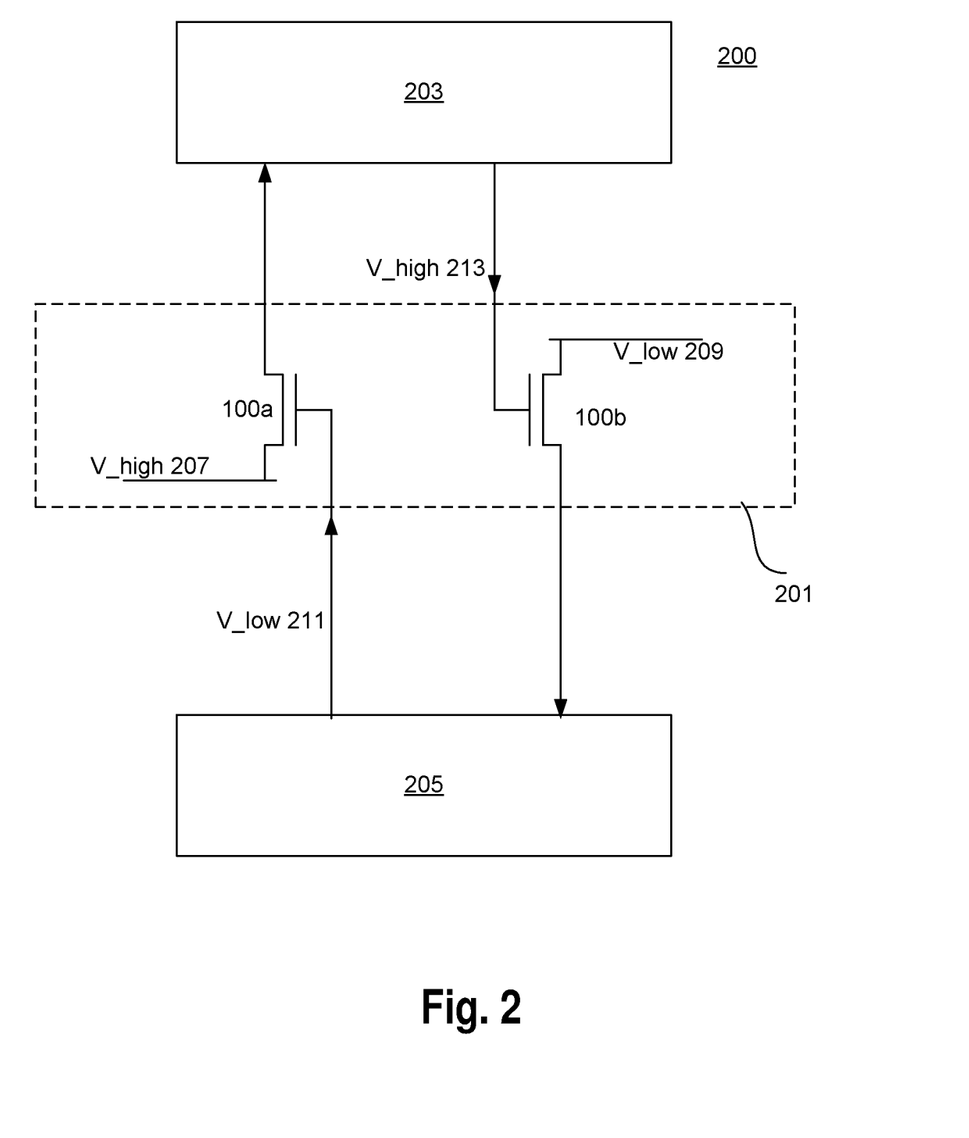
FIG. 2 illustrates a system employing two instances of the transistor of FIG. 1, according to some embodiments.

FIG. 2 illustrates a system 200 employing two instances 100a and 100b of the transistor 100 of FIG. 1, according to some embodiments. The system 200 may comprise a high voltage load 203 (e.g., a load operating at a relatively high voltage, such as a voltage higher than about 1.5 V, about 5 V, in the range of 1.5-5 V, and/or the like). The system 200 may also comprise a controller or logic 205, which may be a core logic, for example. At least a part of the logic 205 may operate at a low voltage (e.g., lower than 1.5 V). An Input/Output (I/O) circuitry 201 may couple the logic 205 and the load 203. The circuitry 201 may be configured for high voltage operation.

In an example, the circuitry 201 may comprise the transistor 100a for selectively transmitting a high voltage V_high 207 to the load 203. The transistor 100a may be controlled by a low voltage signal V_low 211 from the logic 205.

In an example, the circuitry 201 may comprise the transistor 100b for selectively transmitting a low voltage V_low 209 to the logic 205. The transistor 100b may be controlled by a high voltage signal V_high 213 from the load 203.

In some embodiments and as illustrated in FIG. 2, the transistors 100a, 100b may have to handle high voltage. The transistors 100a, 100b may be at least in part similar to the transistor 100 of FIG. 1. For example, ones of the transistors 100a, 100b may have multiple dielectric layers (e.g., dielectric layers 108a, 108b, 108c) between a gate 104 and a channel 112, and/or may have a U shape of the channel 112, as discussed with respect to FIG. 1. Such features of the transistors 100a, 100b may allow the transistors 100a, 100b to handle the high voltage in the system 200.

In some embodiments, the transistor 100 of FIG. 1 and/or the transistors 100a, 100b of FIG. 2 may be fabricated during back-end-of-line (BEOL) or backend processing, although in some other examples the transistors 100a, 100b may be fabricated during front-end-of-line (FEOL) or frontend processing as well. Here, the term "backend" of BEOL generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. The BEOL is the portion of IC fabrication where individual semiconductor devices (whether embedded memory or logic transistors) are interconnected to one another with electrically conductive features such as metal interconnect traces (lines) within a given metallization level and metal-filled conductive vias between multiple metallization levels. These conductive interconnects are embedded in a dielectric material so that the memory device is a monolithic integrated circuit. Conversely, the term "frontend" or FEOL generally refers to a section of the die that includes the traditional active region (e.g., where transistors (e.g., BJT, MOS) are fabricated) and low-level metal layers and corresponding vias that are closer to the active region (e.g., metal layer 5 (M5) and below in a ten metal stack die example).

FIGS. 3A-3E illustrate example processes for formation of the transistor 100 of FIG. 1, according to some embodiments. For example, FIGS. 3A-3E are cross-sectional views of the transistor 100 evolving as example operations for formation of the transistor 100 are performed.

Figure 3A:
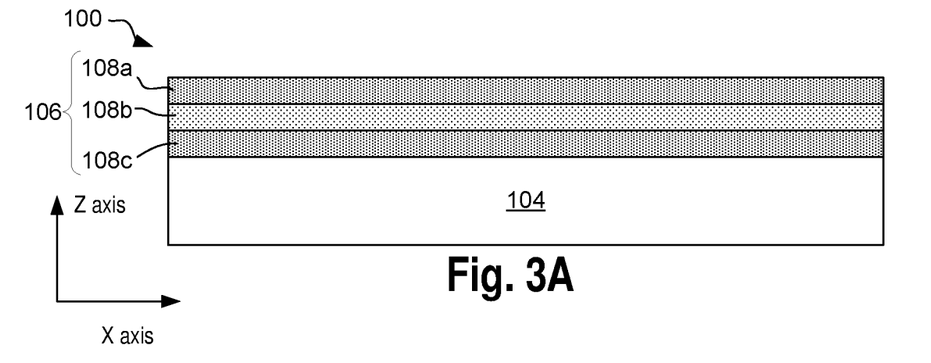
FIGS. 3A-3E illustrate example processes for formation of the transistor of FIG. 1, according to some embodiments.

Referring to FIG. 3A, the gate 104 may be formed. Subsequently, the combined dielectric layer 306 (e.g., comprising the dielectric layers 108a, 108b, 108c) may be formed on the gate 104.

Figure 3B:
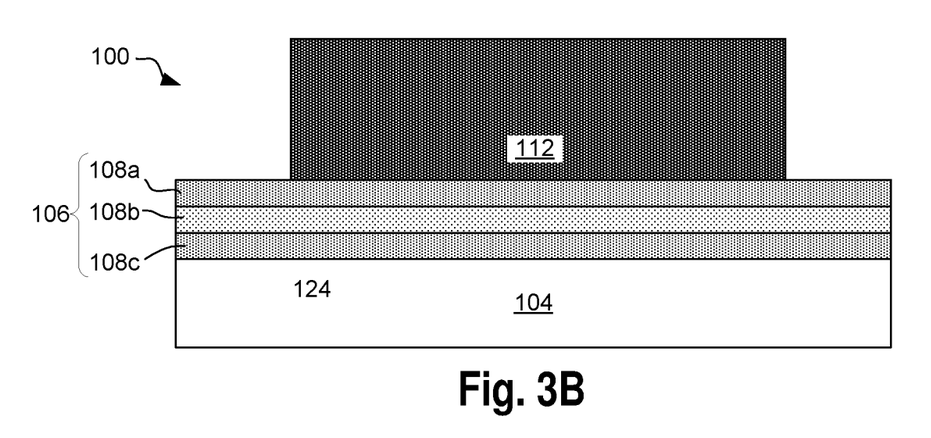

Referring now to FIG. 3B, the channel 112 (e.g., without a recess) may be formed on the combined dielectric layer 306. For example, a thin film comprising material of the channel 112 may be grown on the combined dielectric layer 306.

Figure 3C:
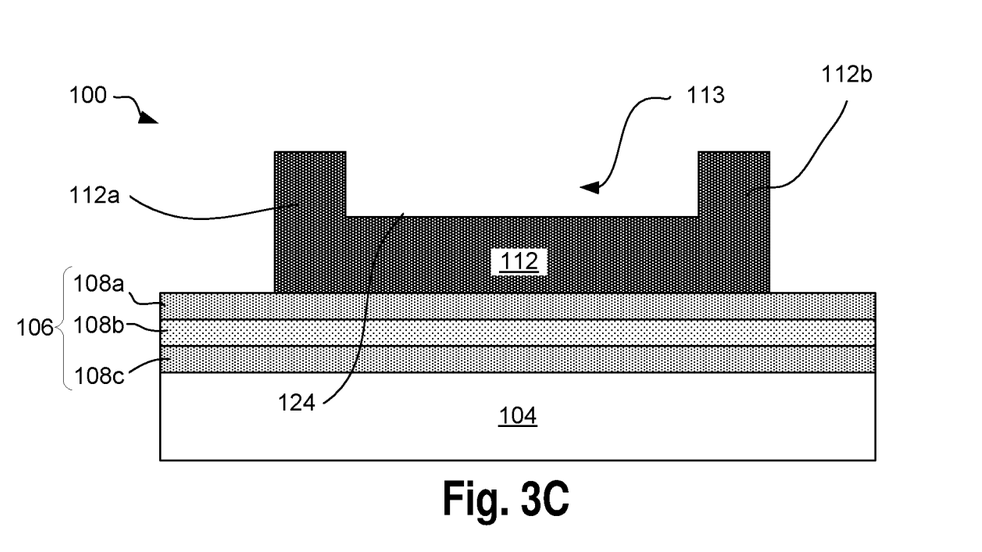

Referring now to FIG. 3C, the channel 112 may be selectively etched or removed to form the recess 113, with the first side 112a and the second side 112b at least in part surrounding the recess 113. Any appropriate anisotropic etching technique may be employed to form the recess 113.

Figure 3D:
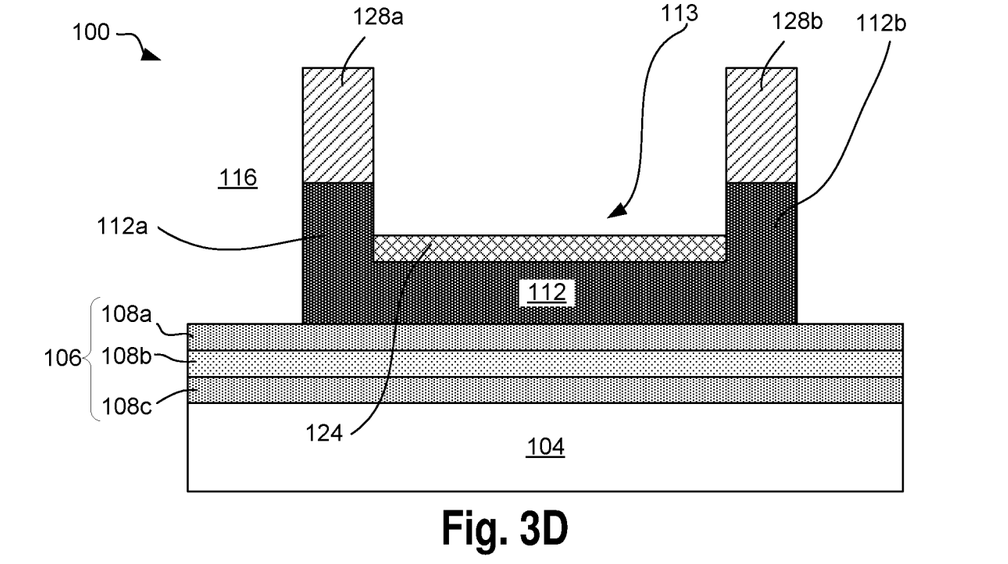
Figure 3E:
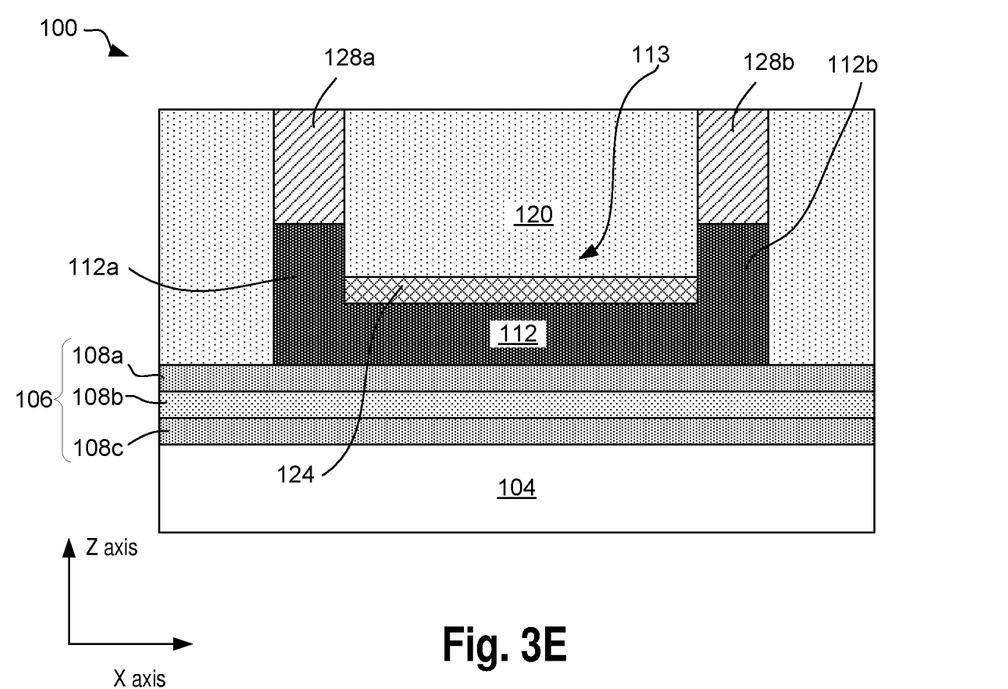

Referring now to FIG. 3D, the passivation layer 124 may be formed within the recess 113, and the source 128a and the drain 128b may be formed on the first side 112a and the second side 112b, respectively, of the channel 112. Referring now to FIG. 3E, the ILD 120 may be deposited to form the transistor 100 of FIG. 1.

Figure 4A:
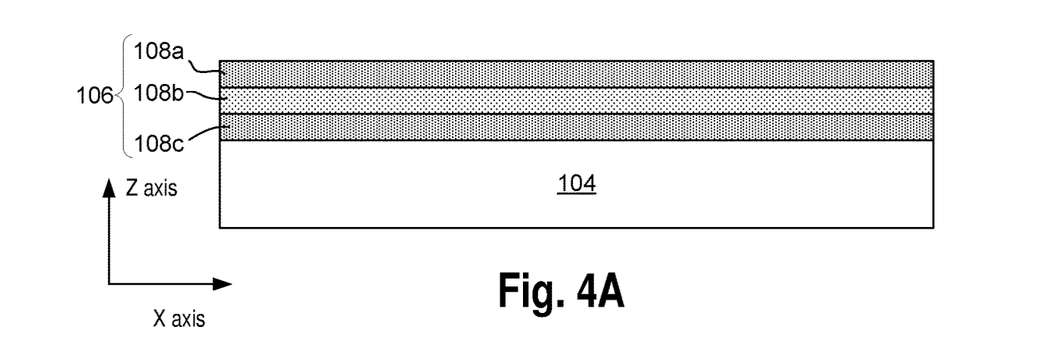
FIGS. 4A-4C illustrate other example processes for formation of the transistor of FIG. 1, according to some embodiments.
Figure 4B:
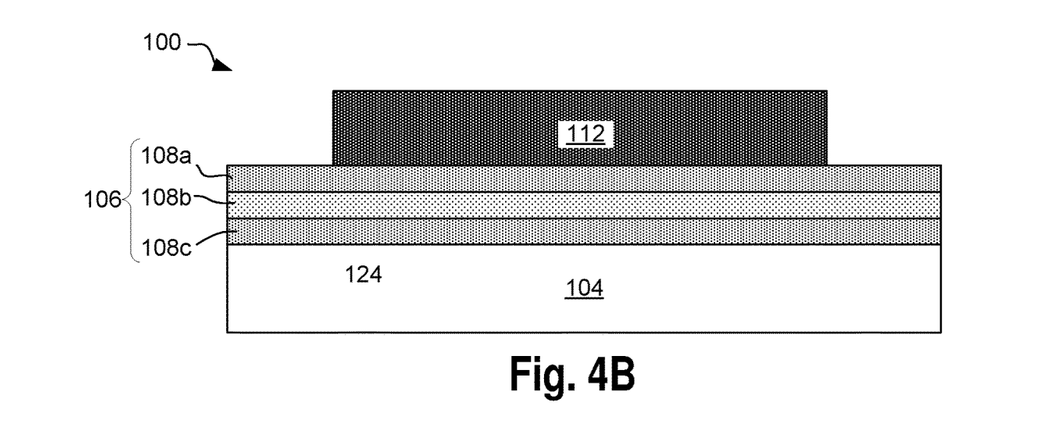
Figure 4C:
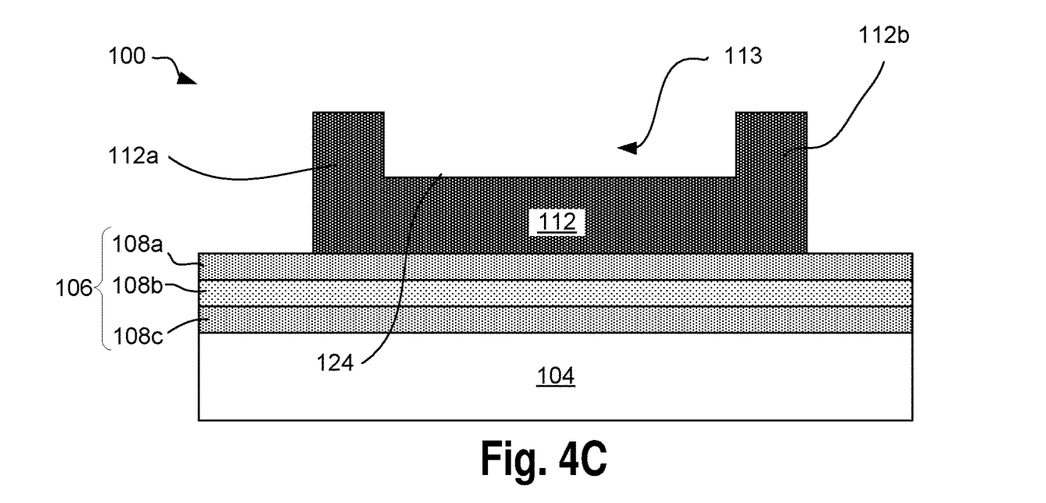

FIGS. 4A-4C illustrate other example processes for formation of the transistor 100 of FIG. 1, according to some embodiments. For example, FIGS. 4A-4C are cross-sectional views of the transistor 100 evolving as example operations for formation of the transistor 100 are performed.

Referring to FIG. 4A, the gate 104 may be formed. Subsequently, the combined dielectric layer 306 (e.g., comprising the dielectric layers 108a, 108b, 108c) may be formed on the gate 104.

Referring now to FIG. 4B, at least a section of the channel 112 (e.g., the mid-section of the channel 112) may be formed on the combined dielectric layer 306. For example, a thin film comprising material of the channel 112 may be grown on the combined dielectric layer 306.

Referring now to FIG. 4C, the growth of the channel 112 may be continued to form the two ends 112a and 112b of the channel 112. Any directional material deposition process (such as physical vapor deposition process, merely as an example) may be employed to grow the channel 112. The component illustrated in FIG. 4C may be at least in part similar to the component illustrated in FIG. 3C. Subsequently, the component illustrated in FIG. 4C may be processed, e.g., as discussed with respect to FIGS. 3D-3E, to form the transistor 100 of FIG. 1.

Figure 5:
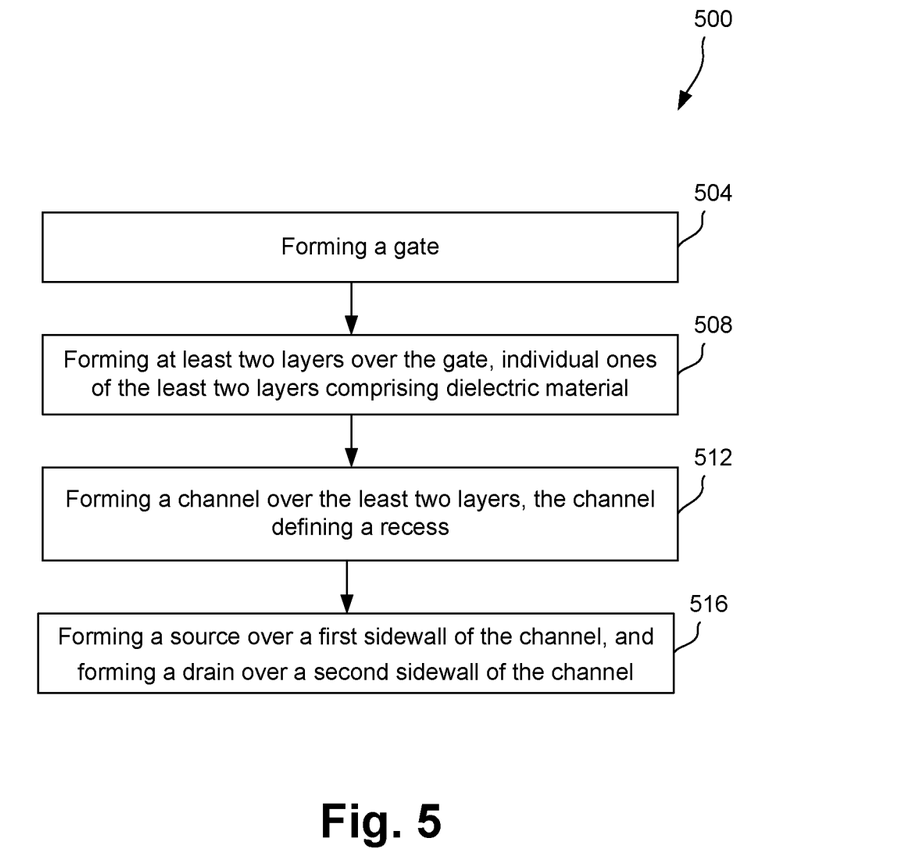
FIG. 5 illustrates a flowchart depicting a method for forming a back-gated TFT having multiple dielectric layers stacked between a gate and a channel, where the channel has a recess, according to some embodiments.

FIG. 5 illustrates a flowchart depicting a method 500 for forming a back-gated TFT (e.g., the transistor 100 of FIG. 1) having multiple dielectric layers stacked between a gate and a channel, where the channel has a recess, according to some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 may be optional in accordance with certain embodiments. The numbering of the blocks presented is for the sake of clarity and is not intended to prescribe an order of operations in which the various blocks must occur.

At 504, a gate (e.g., the gate 104) may be formed, e.g., as discussed with respect to FIGS. 3A and 4A. At 508, at least two layers (e.g., dielectric layers 108a, 108b, 108c) may be formed over the gate, e.g., as also discussed with respect to FIGS. 3A and 4A. Individual ones of the at least two layers may comprise dielectric material. In some embodiments, two adjacent layers of the at least two layers may comprise dissimilar dielectric materials having different bandgaps.

At 512, a channel (e.g., channel 112) may be formed over the least two layers. The channel may define a recess (e.g., recess 113). Formation of the channel may be similar to as discussed with respect to FIGS. 3B-3C, or as discussed with respect to FIGS. 4B-4C. At 516, a source may be formed over a first sidewall of the channel, and a drain may be formed over a second sidewall of the channel, e.g., as discussed with respect to FIG. 3D. Furthermore, passivation layer 124, ILD 120 may be formed, although such processes are not illustrated in FIG. 5.

Various embodiments and examples of this disclosure discuss high voltage transistors having multiple dielectric layers stacked between a gate and a channel, where the channel has a recess. Although these features are discussed with respect to a back-gated TFT, the principles of this disclosure may be applied to any other appropriate type of transistors as well (e.g., not merely back-gated TFT), e.g., to increase the breakdown voltage of such transistors.

Figure 6:
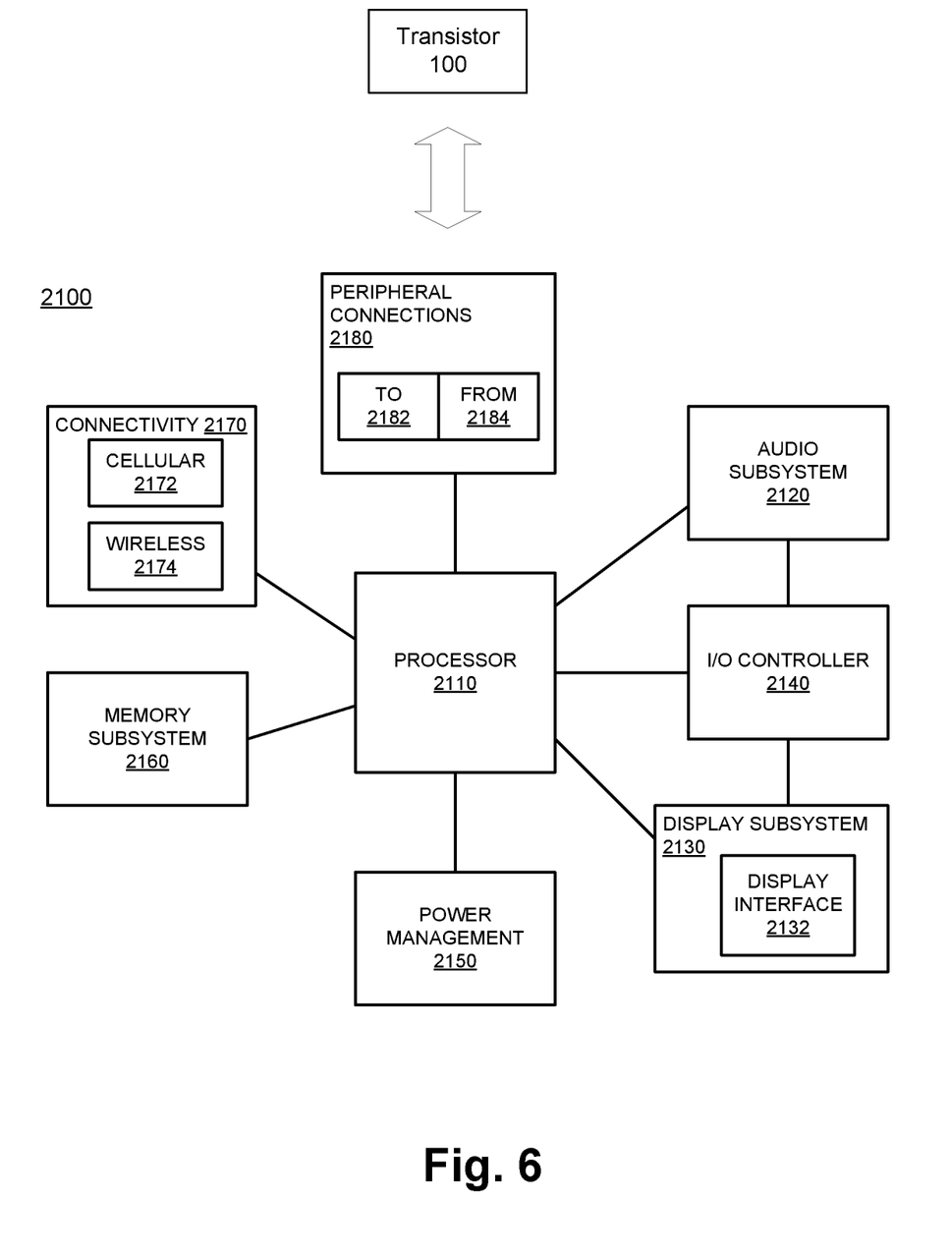
FIG. 6 illustrates a computing device, a smart device, a computing device or a computer system or a SoC (System-on-Chip), where the computing device may comprise a high voltage TFT having multiple dielectric layers stacked between a gate and a channel, where the channel has a recess, according to some embodiments.

FIG. 6 illustrates a computing device 2100, a smart device, a computing device or a computer system or a SoC (System-on-Chip) 2100, where the computing device 2100 may comprise a high voltage TFT (e.g., transistor 100) having multiple dielectric layers stacked between a gate and a channel, where the channel has a recess, according to some embodiments. It is pointed out that those elements of FIG. 6 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may include the transistor 100, e.g., a TFT, having multiple dielectric layers stacked between a gate and a channel, where the channel has a recess, as discussed herein. In some embodiments, the transistor 100 may be suitable for high voltage applications. In some embodiments, instances of the transistor 100 may be used in the processor 2110, a memory of the memory subsystem 2160, and/or in any appropriate component of the computing device 2100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A thin film transistor (TFT) apparatus, comprising:
a gate comprising metal;
a source and a drain;
a semiconductor body;
a multilayer gate dielectric between the gate and the semiconductor body, the multilayer gate dielectric comprising a first layer, a second layer on the first layer, and a third layer on the second layer, the first layer comprising a first material, the second layer comprising a second material, and the third layer comprising the first material, wherein the first or second material comprises hafnium, zirconium, and oxygen, and the other of the first or second material comprises aluminum and oxygen;
wherein the source and drain are substantially coplanar, and wherein the source and drain are opposite the semiconductor body from the gate.

2. The TFT apparatus of claim 1, wherein the first material comprises hafnium, zirconium, and oxygen and the second material comprises aluminum and oxygen.

3. The TFT apparatus of claim 1, wherein the multilayer gate dielectric further comprises a fourth layer comprising a third material.

4. The TFT apparatus of claim 3, wherein the third material comprises hafnium, silicon, oxygen, and nitrogen.

5. The TFT apparatus of claim 1, wherein the semiconductor body comprises a recess, and wherein the recess is opposite the gate from a section of the semiconductor body.

6. The TFT apparatus of claim 1, wherein the multilayer gate dielectric has a thickness of at least 5 nanometers.

7. The TFT apparatus of claim 1, wherein the multilayer gate dielectric has a thickness of not more than 20 nanometers.

8. The TFT apparatus of claim 1, wherein the multilayer gate dielectric has a combined breakdown voltage of at least 1 megavolt/cm.

9. The TFT apparatus of claim 1, wherein the multilayer gate dielectric has a combined dielectric constant of at least 15.

10. The TFT apparatus of claim 1, further comprising:
a die comprising at least one of processor circuitry or memory, wherein the die comprises the gate, the source, the drain, the semiconductor body, and the multilayer gate dielectric; and
a wireless interface to allow the processor to communicate with another device.

11. A thin film transistor (TFT) apparatus, comprising:
a gate comprising metal;
a multilayer gate dielectric over the gate, the multilayer gate dielectric comprising a first layer, a second layer on the first layer, and a third layer on the second layer, the first layer comprising a first material, the second layer comprising a second material, and the third layer comprising the first material, wherein the first or second material comprises hafnium, zirconium, and oxygen, and the other of the first or second material comprises aluminum and oxygen;
a semiconductor body over multilayer gate dielectric, the semiconductor body comprising a mid-section, a first end extending over the mid-section, and a second end extending over the mid-section, wherein the mid-section, the first end, and the second end define a recess within the semiconductor body, wherein the mid-section is between the gate and the recess;
a source on the first end and a drain on the second end, wherein the source and drain are opposite the semiconductor body from the gate.

12. The TFT apparatus of claim 11, further comprising a passivation material within the recess.

13. The TFT apparatus of claim 11, wherein the first material comprises hafnium, zirconium, and oxygen and the second material comprises aluminum and oxygen.

14. The TFT apparatus of claim 11, wherein the multilayer gate dielectric further comprises a fourth layer comprising a third material.

15. The TFT apparatus of claim 14, wherein the third material comprises hafnium, silicon, oxygen, and nitrogen.

16. The TFT apparatus of claim 11, wherein the semiconductor body comprises a recess, and wherein the recess is opposite the gate from a section of the semiconductor body.

17. The TFT apparatus of claim 11, wherein the multilayer gate dielectric has a thickness of at least 5 nanometers or not more than 20 nanometers.

18. The TFT apparatus of claim 11, wherein the multilayer gate dielectric has a combined breakdown voltage of at least 1 megavolt/cm.

19. The TFT apparatus of claim 11, wherein the multilayer gate dielectric has a combined dielectric constant of at least 15.

20. The TFT apparatus of claim 11, further comprising:
a die comprising at least one of processor circuitry or memory, wherein the die comprises the gate, the source, the drain, the semiconductor body, and the multilayer gate dielectric; and
a wireless interface to allow the processor to communicate with another device.

* * * * *